United States Patent [19]
Hayakawa et al.

[11] Patent Number: 4,761,790
[45] Date of Patent: Aug. 2, 1988

[54] OPTICAL SEMICONDUCTOR DEVICE

[75] Inventors: Toshiro Hayakawa, Nara; Takahiro Suyama; Kohsei Takahashi, both of Tenri; Saburo Yamamoto, Nara, all of Japan

[73] Assignee: Sharp Kabushiki Kaisha, Osaka, Japan

[21] Appl. No.: 803,692

[22] Filed: Dec. 2, 1985

[30] Foreign Application Priority Data

Dec. 7, 1984 [JP] Japan ................. 59-259571

[51] Int. Cl.$^4$ ............................................. H01S 3/19
[52] U.S. Cl. ........................................ 372/45; 357/16; 357/17; 357/2
[58] Field of Search .............. 372/45, 46, 44, 43; 357/16, 17, 2, 61

[56] References Cited

U.S. PATENT DOCUMENTS 4,205,329  5/1980  Dingle et al. .................... 372/45

FOREIGN PATENT DOCUMENTS 0124924  4/1984  European Pat. Off.

OTHER PUBLICATIONS

Electronics Letters, vol. 19, No. 5, Mar. 3, 1983, pp. 163–165, Kawamura et al.: In Ga AIP DH laser diodes grown by MBE.
IEEE Electron Device Letters, vol. EDL-4, No. 7, Jul. 1983, pp. 212–214, Laidig et al.: All-binary AlAs-GaAs laser diode.
Japanese Journal of Applied Physics, vol. 22, No. 11, part 2, Nov. 1983, Yao: A new high electron mobility monolayer superlattice.

Primary Examiner—James W. Davie
Assistant Examiner—Georgia Y. Epps
Attorney, Agent, or Firm—Armstrong, Nikaido, Marmelstein & Kubovcik

[57] ABSTRACT

An optical semiconductor device comprising a GaAs substrate and a lamination of molecular layer units formed on said GaAs substrate, said molecular layer units being composed of binary compound semiconductors of InP, GaP and AlP.

1 Claim, 1 Drawing Sheet

OPTICAL SEMICONDUCTOR DEVICE

BACKGROUND OF THE INVENTION
1. Field of the invention:

This invention relates to a high efficiency optical semiconductor device, such as a semiconductor laser device and a light emitting diode, which emits light having a wavelength of less than 700 nm and which utilizes the quantum effect in the light emitting region.

2. Description of the prior art:

In recent years, movement toward the development of an "information society" is rapid, and particularly conspicuous has been development of optical information processing techniques such as optical communication, optical discs, etc., which are based on optical devices incorporating semiconductor laser devices and light-emitting diodes. In these circumstances, optical devices which emit light having a wavelength in the visible region are required, and particularly high expectations exist for visible semiconductor laser devices. At the present, GaAlAs system semiconductor laser devices having an oscillation wavelength of 780 nm are in practical use as light sources for compact discs and video discs. In order to be able to handle a greater amount of information, it is necessary for the diameter of the focused beams to be decreased, and accordingly, semiconductor laser devices generating a shorter wavelength of light are required.

As a semiconductor material with an energy gap that corresponds to this region, $(Al_xGa_{1-x})_yIn_{1-y}P$, the lattice constant of which is matched to the lattice constant of a GaAs substrate, is receiving some attention. Because there are some difficulties with the growth of this material in the current liquid-phase epitaxial method, the newest methods available, molecular beam epitaxy (MBE) and metal-organic chemical vapor deposition (MO-CVD) using organometallic compounds, are being much studied for application with this material. With MBE and MO-CVD, growth occurs depending upon the transport limit. The $(Al_xGa_{1-x})_yIn_{1-y}P$ system contains three elements in Group 3 of the periodic table, so that if the proportions y of In, Al, and Ga are changed from the fixed value, the mis-match of the lattice thereof to that of the GaAs substrate becomes noticeable, and crystals of good quality cannot be obtained. Therefore, it is necessary to control the proportions of Al, Ga, and In to within 0.1%, which calls for high accuracy. However, this is not necessarily easy if the considerations of distribution of this material within the wafer surface and reproducibility are added.

In addition, since it is possible by MBE and/or MO-CVD to have a growth speed of less than 1 $\mu m/h$, it is feasible to control the thickness of thin single crystals. In particular, by MBE, control of the order of layers of monomolecules can be achieved. Thus, MBE and MO-CVD allow the production of the active region of semiconductor laser devices in extremely thin layers, less than 100 Å, thereby allowing for stepwise changes in the density of the carrier, and enabling the production of a quantum well (QW) laser with a lowered threshold. This quantum well laser can be manufactured using $(Al_xGa_{1-x})_yIn_{1-y}P$. For example, as shown in FIG. 3, on an n-GaAs substrate 1, an n-$(Al_{0.6}Ga_{0.4})_{0.5}In_{0.5}P$ cladding layer (the thickness thereof being 1 $\mu m$) 2, a non-doped multi-quantum well (MQW) active layer 3, a p-$(Al_{0.6}Ga_{0.4})_{0.5}In_{0.5}P$ cladding layer (the thickness thereof being 1 $\mu m$) 4 and a p-GaAs cap layer 5 are successively grown by MBE, followed by the formation of a SiO$_2$ film 6 on the cap layer 5. A stripe 9 is formed on the SiO$_2$ film 6 by photolithography, etc., and then ohmic contacts 7 and 8 are formed, resulting in an oxide film striped laser device. The MQW active layer 3 is composed of alternate layers consisting of, as shown in FIG. 4, four non-doped $(Al_{0.15}Ga_{0.85})_{0.5}In_{0.5}P$ well layers (the thickness thereof being 50 Å) 11 and three non-doped $(Al_{0.4}Ga_{0.6})_{0.5}In_{0.5}P$ barrier layers (the thickness thereof being 100 Å) 12. In a QW laser with these components, in order for the lattice thereof to almost completely match that of GaAs, the semiconductors of the cladding layers 2 and 4, of the well layer 11, and of the barrier layer 12 must all be mixed crystals. Therefore, in the QW laser, it is necessary to confine the carriers by a well-shaped potential made in well layer 11. When mixed crystals are used, the chemical compounds (AlP, GaP and InP) that are the basis of the mixed crystals should be randomly mixed, resulting in fluctuations in the potential in the direction within the surface of the interface making up the quantum well, so that an ideal quantum well can not be achieved causing decreased operation efficiency. Moreover, if the well layer 11 and the barrier layer 12 are thin, this phenomenon will be more noticeable, and the problem of fluctuation resulting from mixed crystals within the well layer 11 and the barrier layer 12 will occur.

SUMMARY OF THE INVENTION

The optical semiconductor device of this invention which overcomes the above-discussed and numerous other disadvantages and deficiencies of the prior art, comprises a GaAs substrate and a lamination of molecular layer units formed on said GaAs substrate, said molecular layer units being composed of binary compound semiconductors of InP, GaP and AlP.

The ratio of the number of the InP molecular layers to the total number of the GaP molecular layers and the AlP molecular layers in each of said molecular layer units is, in a preferred embodiment, in the range of 1:1 to 12:13.

Each InP layer is, in a preferred embodiment, composed of a continuous lamination of twenty or less molecular layers.

Thus, the invention described herein makes possible the objects of (1) providing an optical semiconductor device in which molecular layer units composed of binary compound semiconductors of InP, GaP and AlP are laminated on a GaAs substrate in an ordered arrangement, so that neither scattering of light nor fluctuation in potential based on a disordered arrangement of molecular layers occurs and a high operation efficiency and an excellent operational ability can be attained; and (2) providing an optical semiconductor device in which a suppression of the quantum effect due to noticeable fluctuation in potential, which is essential to mixed crystal semiconductors of polycomponents, is eliminated thereby attaining a high operation efficiency and excellent operation liability.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
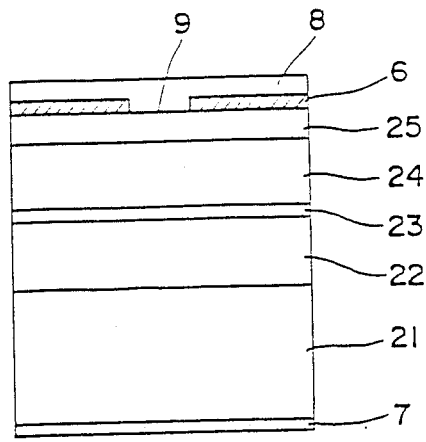
FIG. 1 is a sectional front view showing the multi quantum well (MQW) semiconductor laser device of this invention.
Figure 2:
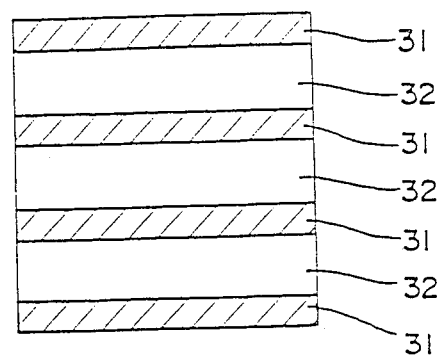
FIG. 2 is a sectional front view showing the active layer 23 of the semiconductor laser device shown in FIG. 1.
Figure 3:
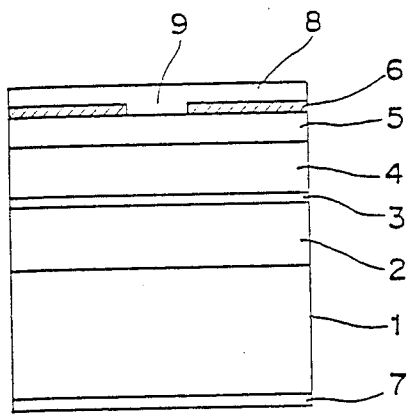
FIG. 3 is sectional front view showing a conventional MQW semiconductor laser device.
Figure 4:
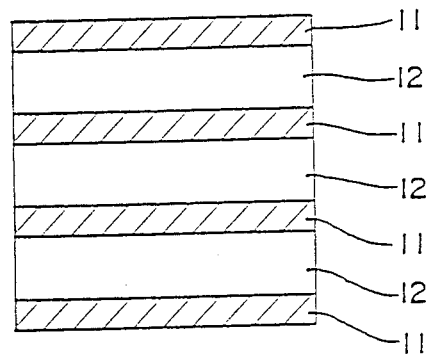
FIG. 4 is a sectional front view showing the active layer 3 of the semiconductor laser device shown in FIG. 3.

FIG. 1 shows a multi quantum well (MQW) semiconductor laser device of this invention, which is produced as follows: On an n-GaAs substrate 21, an n-(AlP)$_3$-(GaP)$_2$(InP)$_5$ superlatticed cladding layer (the thickness thereof being 1 $\mu$m) 22, a non-doped superlatticed MQW active layer (the thickness thereof being approximately 590 Å), a p-(AlP)$_3$(GaP)$_2$(InP)$_5$ superlatticed cladding layer (the thickness thereof being 1 $\mu$m) 24, and a p-GaAs cap layer (the thickness thereof being 0.5 $\mu$m) 25 are successively grown by MBE, by which monomolecular layers are laminated for each layer with a monitor of the changes in the RHEED strength, followed by the formation of a SiO$_2$ film 6 in the same manner as in the laser device shown in FIG. 3. Then, a stripe 9 is formed on the SiO$_2$ film 6, and ohmic contacts 7 and 8 are formed, resulting in an oxide film striped laser device. In order to minimize the influence of a lattice distortion on the differences in the lattice constant between the InP layer and the GaP layer and between the InP layer and the AlP layer, the above-mentioned (AlP)$_3$(GaP)$_2$(InP)$_5$ cladding layers 22 and 24, respectively, are designed to be composed of units of a laminated layer structure composed of (InP)(AlP)(InP)(GaP)(InP)(AlP)(InP)(GaP)(InP)(AlP) in sequence. Each of the (InP), (AlP) and (GaP) layers therein is a monomolecular layer. FIG. 2 shows the structure of the MQW active layer 23, which is composed of alternate layers consisting of four (AlP)$_1$-(GaP)$_5$(InP)$_6$ well layers 31 and three (AlP)$_2$(GaP)$_3$(InP)$_5$ barrier layers 32. The (AlP)$_1$(GaP)$_5$(InP)$_6$ well layer 31 is composed of the lamination (the thickness thereof being approximately 68 Å) of two layer units, each of which is composed of (InP)(GaP)(InP)(GaP)(InP)(AlP)(InP)(GaP)(InP)(GaP)(InP)(GaP) in sequence. Each of the (InP), (AlP) and (GaP) layers therein is also a monomolecular layer. The (AlP)$_2$(GaP)$_3$(InP)$_5$ barrier layer 32 is composed of the lamination (the thickness thereof being approximately 105 Å) of four layer units, each of which is composed of (InP)(GaP)(InP)(AlP)(InP)(GaP)(InP)(AlP)(InP)(GaP) in sequence. Each of the (InP), (AlP) and (GaP) layers therein is also a monomolecular layer.

The resulting superlatticed MQW laser device composed of monomolecular layers as layer units is equivalent to a MQW laser device composed of mixed crystals of (Al$_{0.6}$Ga$_{0.4}$)$_{0.5}$In$_{0.5}$P as the cladding layers 22 and 24, (Al$_{0.17}$Ga$_{0.85}$)$_{0.5}$In$_{0.5}$P as the well layer 31 and (Al$_{0.4}$Ga$_{0.6}$)$_{0.5}$In$_{0.5}$P as the barrier layer 32. The atoms of Al, Ga and In in the above-mentioned superlatticed MQW laser device of this invention are arranged in order, resulting in an ideal multi-quantum well, in which neither the scattering of light nor fluctuation in quantum well potential based on the disordered arrangement of the atoms occur. In particular, the interface between the well layer 31 and the barrier layer 32 clearly exists as an interface between the InP monomolecular layer and the GaP monomolecular layer. Moreover, the interface between the well layer 31 and the cladding layer 22 and the interface between the well layer 31 and the cladding layer 24, respectively, form the interface between the AlP monomolecular layer and the InP monomolecular layer and the interface between the GaP monomolecular layer and the InP monomolecular layer, as well. Therefore, irregularities of the potential at the interfaces never arise.

Another feature of this invention is that in laminating the InP monomolecular layers, the lattice constant of which is quite different from that of the GaAs substrate, the AlP monomolecular layers and the GaP monomolecular layers, both the lattice constants of which are nearly equal to that of the GaAs substrate, on the GaAs substrate, each InP layer is composed of a continuous lamination of less than two monomolecular layers (i.e., one InP layer consists of a single monomolecular layer which is the minimum layer unit) to thereby avoid distortion resulting from a difference in the lattice constant between the InP layer and the GaAs substrate, so that the resulting superlattice can be prevented from undergoing such a rapid deterioration in laser operation that conventional distorted superlattices of GaAsP systems or InGaAs systems undergo. In practice, when the InP layer is composed of the continuous lamination of twenty of less molecular layers, the lattice distortion is so small that the resulting superlattice will undergo no deterioration. In this example of the present invention, the ratio of the number of the InP molecular layers to the total number of the GaP molecular layers and the AlP molecular layers is selected to be 1:1, thereby attaining a good match of the lattice constants between these molecular layers and the GaAs substrate 21. Even though this ratio is set to be in the range of 1:1 to 12:13, the good match of the lattice constants therebetween can be attained with a great accuracy.

Although the above-mentioned example of this invention concerns the MQW semiconductor laser device, this invention can be applied to other semiconductor laser structures using conventional AlGaIn mixed crystal semiconductors, light emitting diodes, etc.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. An optical semiconductor device comprising a GaAs substrate, a lamination of molecular layer units including an optically active MQW layer formed between two cladding layers on said GaAs substrate, a GaAs cap layer formed on said lamination, and contacts formed on said substrate and said cap layer, said molecular layer units being composed of binary compound semiconductors of InP, GaP and AlP, wherein the ratio of the number of the InP molecular layers to the total number of the GaP molecular layers and the AlP molecular layers in each of said molecular layer units constituting said active MQW layer is in the range of 1:1 to 12:13, and each InP layer in said molecular layer units is composed of a continuous lamination of 20 or less molecular layers.

* * * * *